US011592754B2

(12) United States Patent
Chang et al.

(10) Patent No.: US 11,592,754 B2
(45) Date of Patent: Feb. 28, 2023

(54) ADVANCED LOAD PORT FOR PHOTOLITHOGRAPHY MASK INSPECTION TOOL

(71) Applicant: Taiwan Semiconductor Manufacturing Co., Ltd., Hsinchu (TW)

(72) Inventors: Tung-Jung Chang, Hsinchu (TW); Jen-Yang Chung, Hsinchu (TW); Han-Lung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/478,300

(22) Filed: Sep. 17, 2021

(65) Prior Publication Data

US 2022/0342321 A1    Oct. 27, 2022

Related U.S. Application Data

(60) Provisional application No. 63/178,463, filed on Apr. 22, 2021.

(51) Int. Cl.
*G03F 7/20* (2006.01)
*G03F 1/66* (2012.01)
*G03F 1/84* (2012.01)

(52) U.S. Cl.
CPC ............ *G03F 7/70608* (2013.01); *G03F 1/66* (2013.01); *G03F 1/84* (2013.01); *G03F 7/70741* (2013.01)

(58) Field of Classification Search
CPC .... G03F 7/70608; G03F 7/70741; G03F 7/70; G03F 7/70616; G03F 7/7065; G03F 7/70691; G03F 7/70733; G03F 7/708; G03F 7/7085; G03F 7/70858; G03F 7/70866; G03F 7/70908–70941; G03F 7/7095; G03F 7/70975; G03F 7/70983; G03F 7/70991; G03F 1/62; G03F 1/66; G03F 1/68; G03F 1/82; G03F 1/84; G01N 21/956; G01N 2021/95676; H01L 21/67; H01L 21/67242; H01L 21/67288; H01L 21/673;

(Continued)

(56) References Cited

U.S. PATENT DOCUMENTS 9,513,229 B1 * 12/2016 Suzuki .................. G03F 7/7085
10,831,115 B1 * 11/2020 Moon ........................ G03F 1/84
(Continued)

*Primary Examiner* — Christina A Riddle
(74) *Attorney, Agent, or Firm* — Seed IP Law Group LLP

(57) ABSTRACT

A method and a system for inspecting an extreme ultra violet mask and a mask pod for such masks is provided. An EUV mask inspection tool inspects a mask retrieved from a mask pod placed on the load port positioned exterior of the mask inspection tool. The inspection process is performed during a selected period of time. After the inspection process is initiated, a robotic handling mechanism such as a robotic arm or an AMHS picks up the mask pod and inspects the mask pod for foreign particles. A mask pod inspection tool determines whether the mask pod needs cleaning or replacing based on a selected swap criteria. The mask pod is retrieved from the mask pod inspection tool and placed on the load port before the selected period of time lapses. This method and system promotes a reduction in the overall time required for inspecting the mask and the mask pod.

20 Claims, 8 Drawing Sheets

(58) Field of Classification Search
CPC ........... H01L 21/6735; H01L 21/67359; H01L 21/67386; H01L 21/677
USPC ........ 355/18, 30, 52–55, 67–77, 133; 430/5, 430/30; 356/237.1, 239.1–239.6, 356/239.7–739.8, 240.1, 237.2–237.6; 29/592, 407.01
See application file for complete search history.

(56) References Cited

U.S. PATENT DOCUMENTS

| | | | | |
|---|---|---|---|---|
| 2009/0062956 | A1* | 3/2009 | Chen | G03F 7/70741 700/214 |
| 2011/0180108 | A1* | 7/2011 | Pan | H01L 21/67389 134/115 R |
| 2012/0089245 | A1* | 4/2012 | Adhikari | G05B 19/4189 700/226 |
| 2013/0255407 | A1* | 10/2013 | Chilese | G03F 7/70741 414/225.01 |
| 2014/0007371 | A1* | 1/2014 | Lu | H01L 22/12 15/347 |
| 2015/0370179 | A1* | 12/2015 | Suzuki | G03F 1/66 355/72 |
| 2019/0163070 | A1* | 5/2019 | Shang | G03F 7/70883 |

* cited by examiner

ADVANCED LOAD PORT FOR PHOTOLITHOGRAPHY MASK INSPECTION TOOL

BACKGROUND

The semiconductor integrated circuit (IC) industry has experienced rapid growth. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, in semiconductor technologies, a plurality of photomasks (masks) are formed with predesigned IC patterns. The plurality of masks are used during lithography (or photolithography) processes to transfer the predesigned IC patterns to multiple semiconductor wafers. As such, photomask must be substantially devoid of foreign particles during the lithography process. Commonly, photomasks are transported between stations in a semiconductor fabrication facility inside of a transportation/storage pod. Some types of photomasks are protected by pellicles during transportation, however, other types of photomasks—such as masks used for EUV (extreme ultraviolet) lithography—may not be protectable by pellicles. Further, EUV photomasks may be more sensitive to contamination because of smaller feature size. Thus, in some cases, foreign particles attached to the inside of a pod (e.g., mask pod or a photomask pod) may transfer to a photomask during transportation. Accordingly, it may be desirable to thoroughly clean a photomask pod before it is used to transport a photomask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
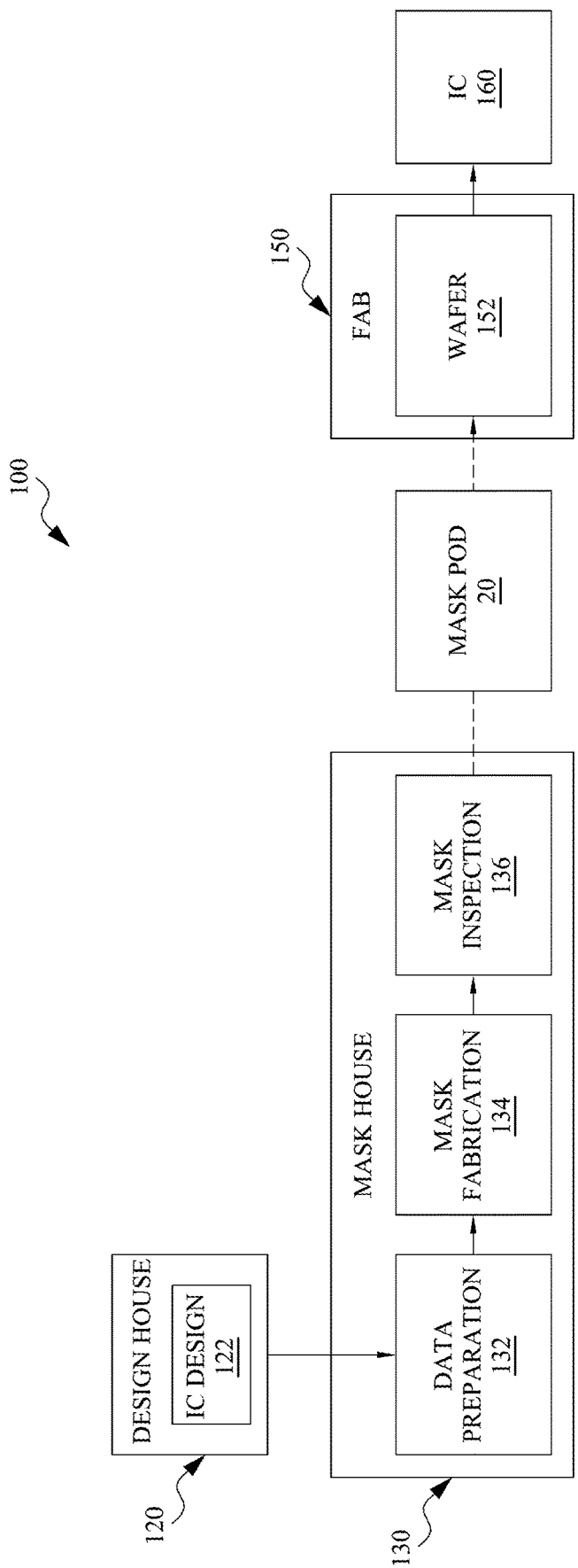
FIG. 1 is a simplified block diagram of an embodiment of an integrated circuit (IC) manufacturing system and an IC manufacturing flow associated with the IC manufacturing system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor lithography processes may use lithographic templates (e.g., photomasks or masks) to optically transfer patterns onto a substrate. Such a process may be accomplished, for example, by projection of a radiation source, through an intervening photomask or mask, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes have been introduced. However, EUV processes are very sensitive to contamination issues. In one example, particle contamination introduced onto an EUV mask can result in significant degradation of the lithographically transferred pattern. The particle contamination may occur during handling and transportation of mask pods that include the EUV masks.

As described above, it is important that an EUV mask be as clean and defect-free as possible. It has been found that when an EUV mask is exposed to the atmosphere, a thin layer of carbon buildup accumulates on the surface of the mask. This layer of carbon buildup is typically less than 5 nanometers thick. This layer accumulates from the carbon of $CO_2$ gas within the atmosphere to which the mask is exposed to. The carbon buildup is a different issue than the particles that can accumulate during use of the mask. It is equally important that the mask pod housing the EUV mask are also clean and defect free from foreign particles as possible as any foreign particles associated with the mask pod may find their way to the EUV mask inside the mask pod.

An internal robotic handling system includes a variety of automated systems to move a mask or a mask pod through the various tools, including a lithography tool. For example, the robotic handling system may have robotically controlled arms to grasp a mask (or mask pod) and move the mask (or mask pod) from one module to another. The robotic handling system may include various motorized gears to move the robotic arms. The robotic handling mechanism may also include movable tracks on which a mask (or mask pod) may be placed to move the mask (or mask pod) between the modules. The robotic handling mechanism may include multiple robotic arms throughout the interior of the lithography tool. The robotic arms may be configured to place a mask (or mask pod) in a precise location within various modules.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, a mask pod 20, and an IC manufacturer 150 (e.g., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and IC manufacturer 150 may be a single entity or separate entities.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask data preparation 132, where the IC design layout 122 is translated into a form that can be physically written by a mask writer. Data preparation 132 may include optical proximity correction (OPC) and a lithography process check (LPC) to compensate for image errors and simulate mask fabrication. The mask house 130 also performs mask fabrication 134, where the design layout prepared by the mask data preparation 132 is modified to comply with a particular mask writer and/or mask manufacturer and is then fabricated. In the present embodiment, the mask data preparation 132 and mask fabrication 134 are illustrated as separate elements, however, the mask data preparation 132 and mask fabrication 134 can be collectively referred to as mask data preparation.

During mask fabrication 134, a mask or group of masks are fabricated based on the modified IC design layout. For example, an electron-beam (e-beam) or a mechanism of multiple e-beams is used to form a pattern on a mask (photomask or mask) based on the modified IC design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art. In other embodiments, the photomask may be an EUV (extreme ultraviolet) photomask suitable for lithography processes using light radiation having wavelengths in the range of about 13.5 nm or less.

After a mask has been fabricated, the mask house 130 performs a mask inspection 136 (in a mask inspection tool 12; see FIG. 2) to determine if the fabricated mask includes any defects, such as full-height and non-full-height defects. If any defects are detected, the mask may be cleaned or the IC design may be modified further depending on the types of defects detected.

It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 134. Additionally, the processes applied to the IC design layout 122 during mask fabrication 134 and mask inspection 136 may be executed in a variety of different orders and may include a variety of different and/or additional steps.

After a photomask has been fabricated by the mask house 130, it may be transported to various locations, such as the IC manufacturer 150 (e.g., fab). To prevent damage during transportation, photomasks are stored and transported in transportation containers/carriers, such as a photomask pod 20 shown in FIG. 2.

Figure 3B:
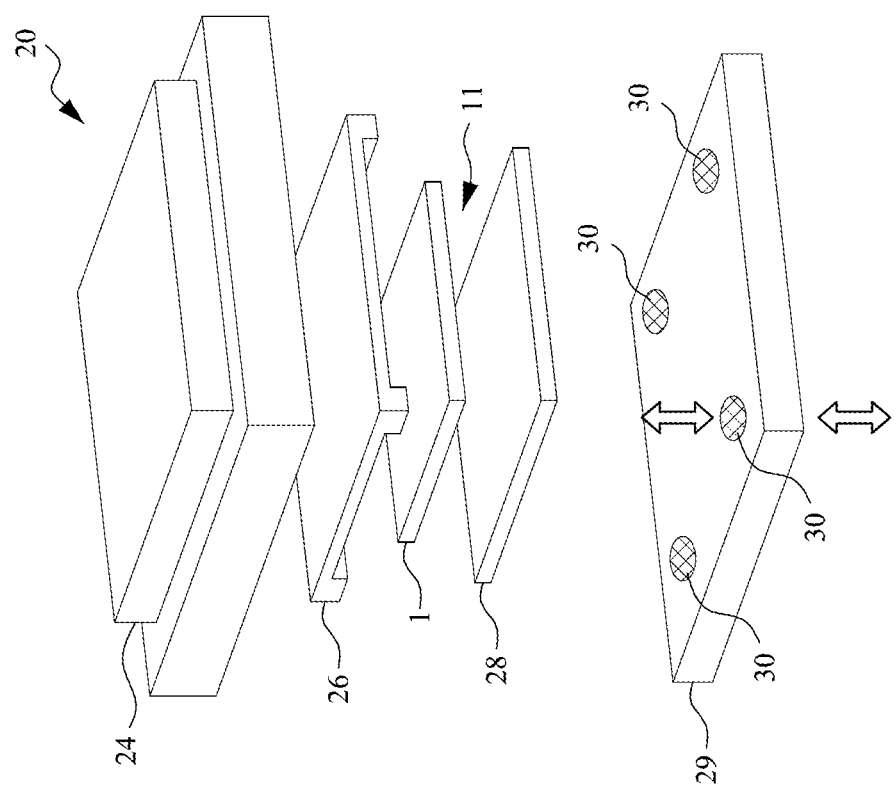
FIG. 3B is an exemplary diagram showing a detailed mask pod shown in FIG. 3A.
Figure 3A:
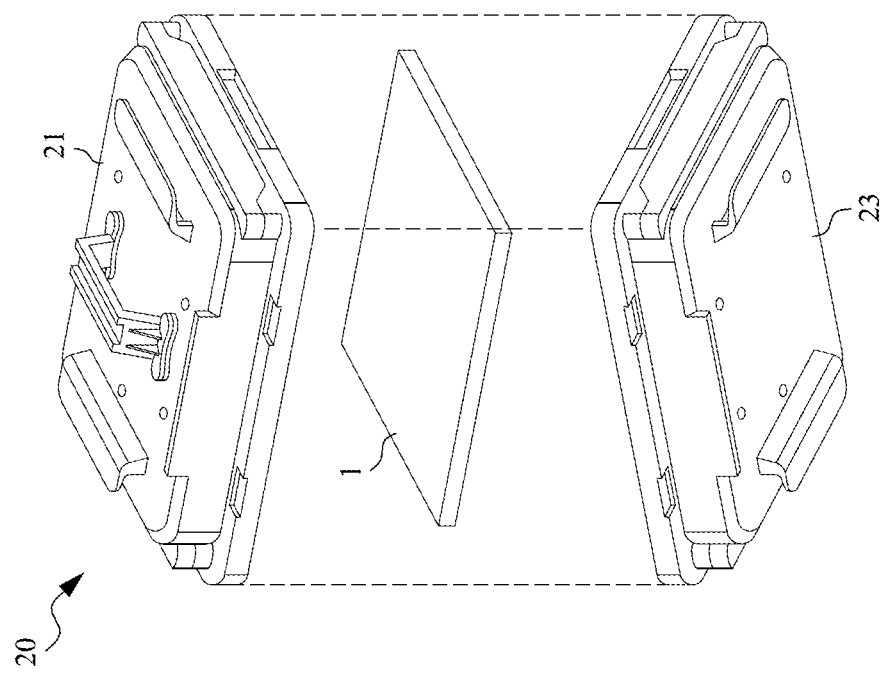
FIG. 3A illustrates an exploded perspective view of an example photomask pod and a photomask stored in the pod.

FIG. 3A illustrates an exploded perspective view of an example photomask pod 20 and a photomask 1 stored in the pod 20. Specifically, the pod 20 may include a top cover portion 21 and a bottom cover portion 23. In one embodiment, the pod 20 may have a dual pod design and include various other portions and features, for instance, the pod 20 may include an inner pod assembly with a cover and base plate and an outer pod assembly that fits around the inner pod assembly. For the sake of clarity, these are shown in FIG. 3B. In the illustrated embodiment, the pod 20 is designed to hold an EUV photomask that is not protected by a pellicle. Thus, it is desirable for the pod 20 to be entirely or substantially free of foreign particles before the photomask 1 is transported inside of the pod 20 so that the photomask 1 is not contaminated. In other embodiments, the pod 20 may be some other type of storage or transportation receptacle that is more suitable for use when it is free or substantially free of foreign particles.

Referring back to FIG. 1, the IC manufacturer 150, such as a semiconductor foundry, uses the mask (or masks) fabricated by the mask house 130 to fabricate the IC device 160. The IC manufacturer 150 is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer 152 is fabricated using the mask 1 (or masks 1) to form the IC device 160. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer or other suitable processes.

Figure 2:
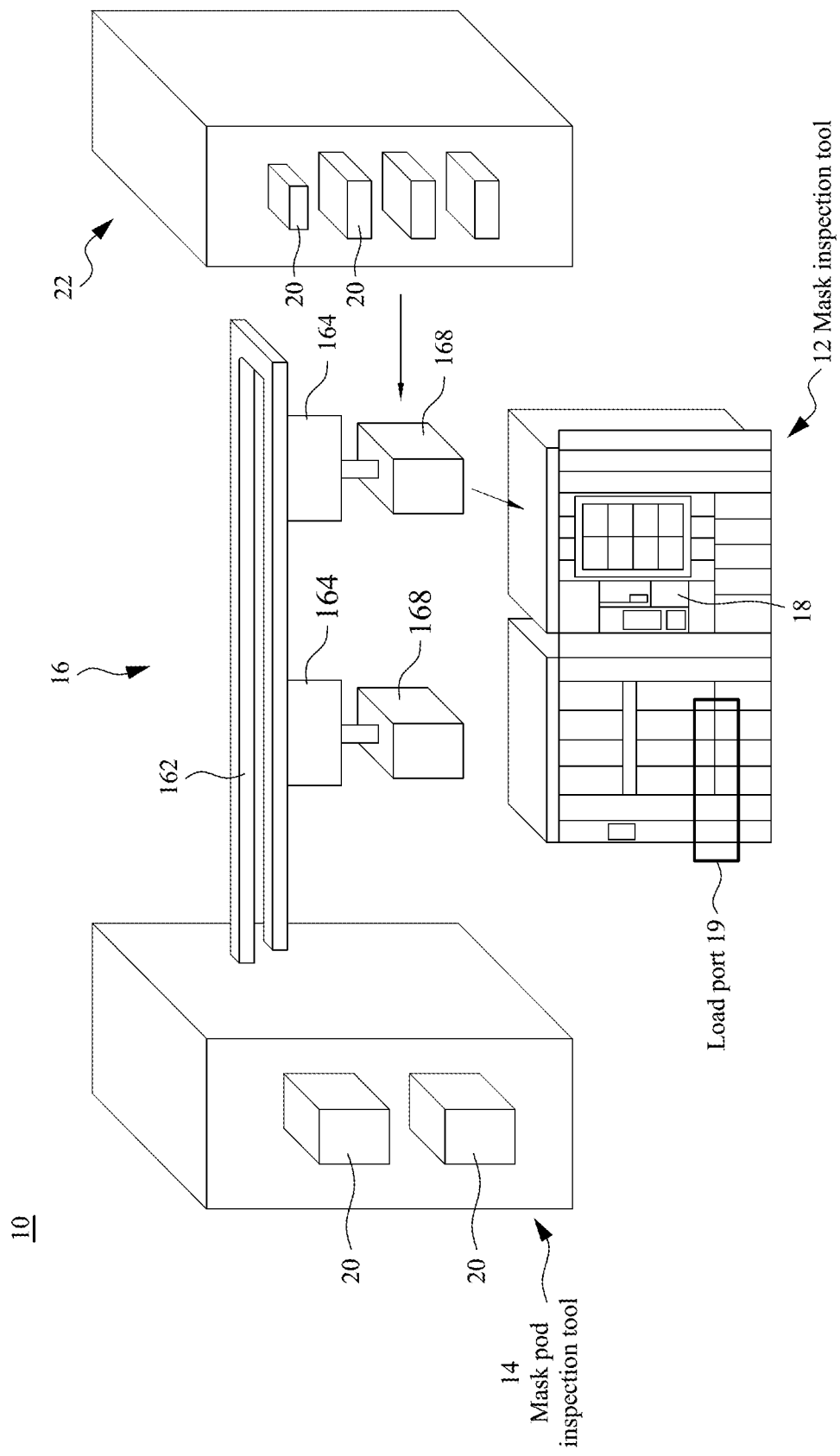
FIG. 2 is a schematic perspective diagram showing an embodiment of a system including a mask inspection tool, a mask pod inspection tool, an automatic transport tool, and one or more processors.

FIG. 2 is a schematic perspective diagram showing an embodiment of a system 10 including a mask inspection tool 12, a mask pod inspection tool 14, an automatic transport tool 16, and one or more processors 18. In some embodiments, the automatic transport tool 16 refers to an automated material handling system (AMHS). This can include for example automatic guided vehicles (AGVs), personal guided vehicles (PGVs), rail guided vehicles (RGVs), overhead shuttles (OHSs), and overhead hoist transport (OHT) systems. In some embodiments, the automatic transport tool 16 may include one or more robotic arms within the tools such as a mask inspection tool 12 and a mask pod inspection tool 14. Automatic transport vehicles such as OHT may be included as an example of automatic transport tool 16 and are compatible with OHT rails which allows the usage of existing OHT rails for mask pod transportation. The processor or processors 18 are operatively coupled to the mask inspection tool 12, the mask pod inspection tool 14, the automatic transport tool 16 so that the signals (e.g., commands, instructions, or the like sent by the processor 18) sent to these tools 12, 14, 16 cause the tools 12, 14, 16 to operate based on the specific signals of the processor 18 (e.g., mostly instructions from the processor to perform or execute the specific instructions according to the embodiments of the present disclosure). As used herein, the term "processor" may include any electrical circuitry, features, components, an assembly of electronic components or the like. That is, the "processor" may include any microprocessor-based system including systems using microcontrollers, integrated circuit, chip, microchip, reduced instruction set computers (RISC), application specific integrated circuits (ASICs), field-programmable gate arrays (FPGAs), graphical processing units (GPUs), logic circuits, and any other circuit capable of executing the functions described herein. The above examples are exemplary only, and are thus not intended to limit in any way the definition and/or meaning of the term "processor".

In some embodiments, the system 10 includes one or more OHT systems (which may be included in the automatic transport tool 16), which includes a network of stationary rails (or tracks) 162 operable to guide the movement of one or more OHT carriers 164 supported and suspended from the rails 162. The OHT carriers 164 may be wheeled OHT vehicles. In some embodiments, the rails 162 are monorails that are mounted to and suspended from the ceiling and/or walls of the FAB. Rails 162 may have any suitable cross-sectional configuration as will be appreciated by those in the art so long as the OHT carriers 164 are appropriately supported from the rails for rolling motion. Multiple photolithography masks and mask pods may be transported together by the automatic transport tool 16 between load ports of different substrate processing tools during semiconductor fabrication processes. The term "substrate" is used herein broadly to include a wafer, a mask, a reticle, a photolithography mask, or the like. Here, the substrate processing tools may refer to the mask inspection tool 12 and the mask pod inspection tool 14.

The OHT carriers 164 may transport a mask pod container 168 that contains a mask pod 20. The mask pod 20, including the mask 1, may need to be transported to multiple lithography tools such as the mask inspection tool 12 at various times throughout a semiconductor process. Lithography tools can be any type of lithography processing, metrology, inspection, cleaning, testing tools, or other suitable tools. For example, a lithography tool can be the mask inspection tool 12, an EUV scanner, an EUV mask cleaning chamber, or the mask pod inspection tool 14. The lithography tool includes one or more load ports to facilitate insertion or removal of the mask pod 20 into or out of the lithography tool. The lithography tools are located inside various facilities of the FAB.

Still referring to FIG. 2, the mask pod 20 includes an EUV mask pod. The OHT carriers 164 are operable to pick up, raise/lower, hold, articulate, and release the mask pod container 168 in a generally horizontal or lateral direction from one location to another within the FAB. For example, the mask pod container 168 can receive a mask pod 20 from the mask pod stocker 22 located in one building, then transport to a lithography tool (e.g., mask inspection tool 12, mask pod inspection tool 14, and EUV scanner or the like) located in another building (or the same building) along the OHT rails 162. In some embodiments, the mask pod stocker 22 which stores one or more mask pods 20 may have its own robotic arms to automatically receive the mask pod 20 included in the mask pod container 168 from the OHT carrier 164. Similarly, in some embodiments, the mask pod inspection tool 14 where the mask pod is inspected to determine whether the mask pod needs cleaning or replacement may also have its own robotic arms to automatically receive the mask pod 20 included in the mask pod container 168 from the OHT carrier 164. Further, the mask inspection tool 12 where the mask is inspected to determine whether the mask or mask pod needs cleaning or replacement may also have its own robotic arms to automatically receive the mask pod 20 included in the mask pod container 168 from the OHT carrier 164. Alternatively, in an embodiment, the OHT carrier 164 may load the mask pod 20 on a load port of the mask inspection tool 12 which is coupled to the exterior of the mask inspection tool 12. The robotic arms of the mask inspection tool 12 may remove the mask 1 from inside the mask pod 20. The robotic arms of the mask inspection tool 12 may place the mask 1 inside the mask inspection tool 12 for inspection of the surfaces of the mask 1. The mask pod 20 that is now empty may be removed from the load port of the mask inspection tool 12 by the AMHS and the empty mask pod may be provided to the mask pod inspection tool 14 for inspecting the inner pod and the outer pod of the mask pod 20 to determine whether the mask pod 20 needs cleaning or replacement. If the mask pod 20 requires replacing, the AMHS may retrieve the mask pod 20 from the mask pod stocker 22 and replace the mask pod with a new mask pod. In some embodiments, the mask pod stocker 22 and the mask pod inspection tool 14 may be adjacent to each other. In some embodiments, the mask pod inspection tool 14 and the mask pod stocker 22 may be provided as a single tool. In these embodiments, the time for retrieving a new mask pod in case the mask pod needs replacing can be reduced. In other embodiments, the inspection of the mask pod and the retrieving of a new mask pod occurs simultaneously with the inspection of the mask.

FIG. 3B is an exemplary diagram showing a detailed mask pod 20 shown in FIG. 3A. In some embodiments, the mask pod 20 is an EUV reticle pod. As described herein, the mask pod 20 may be a dual pod carrier including an outer pod and an inner pod. The outer pod includes an outer pod base 29 and an outer pot shell 24, and the inner pod includes an inner baseplate 28 and an inner cover 26. The top cover portion 21 includes the outer pot shell 24 and the bottom cover portion 23 includes the outer pod base 29. The mask 1 is housed within the inner pod between the inner baseplate 28 and the inner cover 26. Additionally, in some embodiments, the mask 1 is oriented face-down within the inner pod, leaving a small gap between the front surface 11 of the mask 1 and the inner baseplate 28, to minimize particle contamination of the front surface 11. In some embodiments, the inner pod cover 26 includes one or more openings (not shown) to allow for a flow of gas within the inner pod for cleaning purpose. The gas may be directed into the mask pod 20 by way of one or more of ports 30 on the outer pod base 29.

At various times throughout a semiconductor process, the mask pod 20, including the mask 1, may be stored in a mask pod stocker 22 located inside a semiconductor fabrication facility (FAB). As illustrated in FIG. 2, the mask pod stocker 22 including at least one mask pod 20 stores at least one mask 1. The mask pod stocker 22 also includes one or more load ports for insertion or removal of the mask pods 20 into or out of the mask pod stocker 22.

Figure 4:
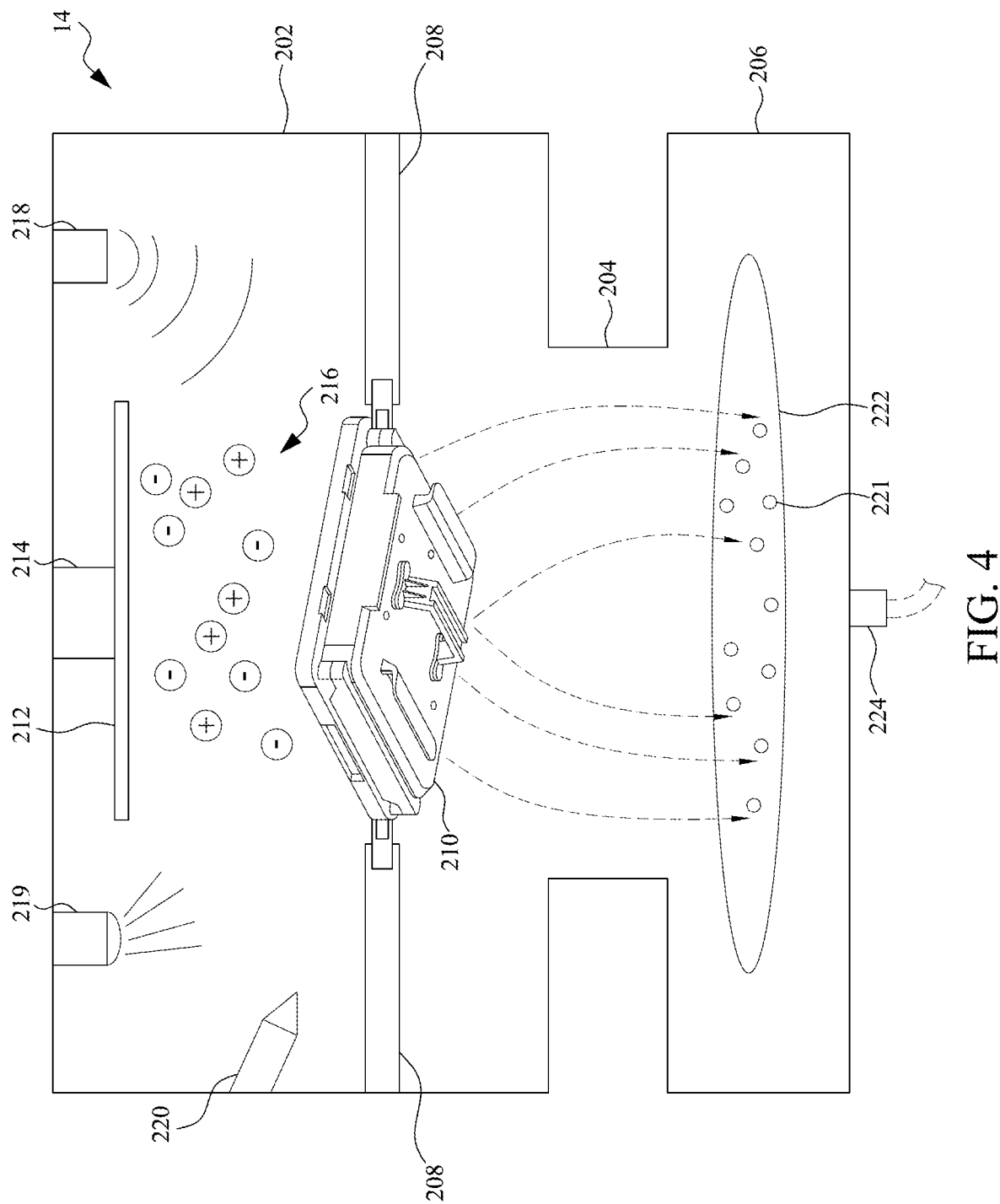
FIG. 4 illustrates an example mask pod inspection tool configured to remove foreign particles from photomask transportation and mask pods.

FIG. 4 illustrates an example mask pod inspection tool configured to remove foreign particles from photomask transportation and mask pods. In one embodiment, the mask pod inspection tool 14 is operable to remove particles sized in the range of about 10-35 nm. These size particles are especially disruptive of lithography processes utilizing EUV photomasks.

In more detail, the mask pod inspection tool 14 includes a cleaning chamber 202, a pass-through chamber 204, and a particle collection chamber 206, where the pass-through chamber couples the cleaning chamber to the particle collection chamber such that they are in fluid communication. The cleaning chamber 202 may be sealed and pressurized so the pressure within the chamber may be controlled to suit the specific cleaning process employed. For instance, a vacuum may be formed in the cleaning chamber 202 to assist in the removal of all moisture from the article being cleaned. Further, in one embodiment, a specific atmospheric pressure may be created within the chamber so as to most efficiently propagate ultrasonic sounds toward an article being cleaned. The cleaning chamber 202 includes retaining structures 208 that are configured to hold an article 210 to be cleaned within the cleaning chamber 202. The retaining structures 208 are adjustable so that they may retain a wide variety of differently shaped and sized articles. For example, in the illustrated embodiment of FIG. 4, the article 210 is a cover of a photomask transportation pod, such as the top cover portion 21 of FIG. 3A. This is merely an example and the cover of the outer pod or the cover of the inner pod may also be cleaned in a similar manner. Because the retaining structures are adjustable, a photomask pod 20 may be disassembled and each piece may be separately cleaned within the chamber 202 even if they are different sizes and shapes. Further, the retaining structures 208 are rotatable relative to the interior of the chamber 202. Accordingly, the article 210 may be rotated during a cleaning process so that all surfaces may be exposed and also so that loose particles disposed on a surface of the article 210 may fall away from the article during the rotation.

The mask pod inspection tool 14 further includes a gas distributor 212 disposed within the cleaning chamber 202. The gas distributor 212 is configured to inject gas molecules into the cleaning chamber 202 for various particle removal techniques. A gas inlet 214 feeds gas from various sources into the gas distributor 212 where it is dispersed into the cleaning chamber 202. In one embodiment, the gas inlet 214 includes a control mechanism to control the amount and velocity of the gas entering the cleaning chamber 202. As will be discussed in greater detail below, the gas distributor includes a plurality of distribution apertures 250 through which the gas enters the chamber. In one embodiment, the plurality of distribution apertures 250 may vary in size and shape. Depending on the cleaning process employed by the mask pod inspection tool 14, various different types of gas may be distributed into the cleaning chamber 202. For example, nitrogen, argon, and oxygen are some examples of gases that may be distributed into the cleaning chamber to remove particles from an article such as the article 210. In the illustrated embodiment, the gas distributor is operable to disburse electrically charged gas molecules 216 into the cleaning chamber 210 during a cleaning process. In one embodiment, the distributor 212 includes a charging mechanism to charge the gas molecules as they flow through the distributor. Such charged gas molecules may be utilized to remove particles in various manners. For example, foreign particles may be attracted to and thus attached to the article 210 because the particles have an electrical charge, static or otherwise. Subjecting the charged foreign particles to charged gas may neutralize the particles, weakening their attraction to the article 210. Further, the force of the gas 216 as projected out of the distributor 212 may also forcibly remove any particles attached to the article 210. The manner in which the charged gas 216 may be utilized to remove foreign particles is discussed in greater detail in association with FIG. 5.

The mask pod inspection tool 14 further includes a vibration generator 218 disposed in the cleaning chamber 202. The vibration generator 218 is operable to impart physical movement such as vibrations to the article 210, thus facilitating the removal of foreign particles from the article's surface. In one embodiment, the vibration generator 218 may be utilized in conjunction with the charged gas 216 to remove foreign particles from the cover. For example, the charged gas 216 may neutralize any charged foreign particles thus lessening their attraction to the article 210. If the neutralized particles do not immediately detach from the article 210, the vibration generator 218 is operable to vibrate the article and shake loose the remaining particles. The vibration generator 218 may utilize a variety of mechanisms to impart movement to the article to be cleaned in the chamber 202. In one embodiment, the vibration generator 218 directs ultrasonic waves at the cover 210. Such ultrasonic waves impart vibrations into the cover 210, thus simulating the vibrations caused by transportation. Ideally, any foreign particles that would shake loose onto a photomask during transportation will shake loose during the cleaning process instead. To facilitate the propagation of ultrasonic waves through the cleaning chamber 202, the chamber 210 may be pressurized to a specific pressure to most efficiently effect the cleaning process. In one embodiment, the vibration generator 218 may vary the intensity, power, and wavelength of the ultrasonic waves directed at the article 210. In another embodiment, the vibration generator 218 directs pulsed laser energy at the article 210 to impart shock waves in the article. For instance, the vibration generator 218 may direct a laser pulse of high power (e.g., over 109 W/cm$^2$) and short duration (e.g. a nanosecond) at the article 210 and as the laser energy impacts the surface of the article a shock wave is generated. This shock wave may loosen or entirely detach foreign particles attached to the article 210. Because laser energy is focused on a particular location, the vibration generator 218 may be configured to scan the pulsed laser energy across the surface of the article 210. The power and duration of the laser emanating from the vibration generator may be tuned based on the type of material out of which the article is constructed. In alternative embodiments, the vibration generator 218 may utilize different techniques to generate vibrations or other movement in the article 210 such that foreign particles attached thereto are loosened or detached.

In the illustrated embodiment, the mask pod inspection tool 14 further includes an ultraviolet (UV) light source 219 disposed in the cleaning chamber 202. The UV light source 219 is configured to be used in conjunction with oxygen ($O_2$) gas injected into the cleaning chamber 219 by the gas distributor 212 to create ozone gas ($O_3$). Specifically, ozone gas formed in the cleaning chamber 202 by oxygen absorbing UV light is utilized to decompose any organic foreign particles attached to the article 210. The ozone gas may not remove organic particles from the article 210 but it may shrink them, making them easier to remove by other methods such as vibrations. Further, the mask pod inspection tool 14 includes a carbon dioxide ($CO_2$) snow jet 220 to aid in the removal of foreign particles attached to the article 210. Specifically, the snow jet 220 ejects a stream of crystallized carbon dioxide particles that impacts the surface of the article 210 and dislodges any foreign particles attached thereto through momentum transfer.

It is understood that the particle removal tool (or the mask pod inspection tool 14) described above including the gas distributor 212, the vibration generator 218, the UV light source 219, and the carbon dioxide (CO2) snow jet 220 and the methods of cleaning associated with each are simply examples of cleaning mechanisms that may be employed within the cleaning chamber 202. Various embodiments of the mask pod inspection tool 14 may include different subsets of the cleaning mechanisms and they may be used alone or in combination to effectuate particle removal from the article 210. Further, additional and/or different cleaning systems and methods may be employed to clean articles within the cleaning chamber 202 without departing from the scope of the present disclosure. For instance, the retaining structures 208 may be operable to physically vibrate an article held between them to dislodge particles attached to the article.

While subjecting the article 210 to the various cleaning mechanism described above, foreign particles 221 will ideally detach from the article. The mask pod inspection tool 14 is configured such that the detached particles 221 fall from the article 210 and flow through the pass-through chamber 204 and into the particle collection chamber 206. The particle collection chamber 206 includes a particle collection surface 222 that is disposed beneath the pass-through chamber 204. In the illustrated embodiment, the pass-through chamber 204 is configured to direct the detached particles 221 onto the particle collection surface 222. In that regard, the particle collection surface 222 has a width greater or equal to the pass-through chamber 204 so that all particles moving through the pass-through chamber 204 are deposited on the surface 222. Further, the particle collection chamber 206 includes a gas outlet valve 224 that expels gas out of the mask pod inspection tool 14. The gas outlet value 224 is disposed within the particle collection chamber such that gas output by the gas distributor 212 flows past the article 210, through the pass-through chamber 204, and in the direction of the particle collection surface 222. Thus, as gas flows through the mask pod inspection tool 14, it carries any detached foreign particles 221 away from the article 210 and deposits them on the particle collection surface 222. In one embodiment, the gas outlet value is coupled to a pumping system (not illustrated) that creates a pressure differential in the particle collection chamber 206 such that detached particles 221 flow more efficiently toward the particle collection surface 222.

In one embodiment, the particle collection surface 222 is a silicon wafer, but in alternative embodiments, the surface 222 may be any other surface operable to collect foreign particles deposited thereon. In some embodiments, the particle collection surface 222 includes a coating configured to secure particles to the surface once they are deposited. In another embodiment, an electric charge is applied to the particle collection surface 222 to attract foreign particles that detached from the article 210.

After a cleaning process has been completed and foreign particles have detached from the article 210 and been deposited onto the particle collection surface 222, the collection surface is removed from the particle collection chamber 206 and inspected. If no foreign particles are detected on the collection surface, it is likely that the article 210 is free or substantially free of foreign particles. If particles are detected on the collection surface, additional particles may remain attached to the article, and thus another round of cleaning may be desired. In one embodiment, the collection surface 222 may be inspected with photomask inspections tools such as optical inspection tools and electron-beam (e-beam) inspection tools to determine if the collection surface has any foreign particles deposited thereon. Because an e-beam inspection tool (i.e., scanning electron microscope) is capable of higher resolution imaging than an optical inspection tool, it may be better suited for inspecting for particles on the collection surface that are below about 20 nm in size. In other embodiments, the collection surface 222 may be inspected with different and/or additional inspection tools such as a scanning probe microscope system, a laser microscope system, a transmission electron microscope system, a focus ion beam microscope system, or other suitable imaging tools. In one embodiment, the particle collection surface 222 is inspected before it is inserted into the mask pod inspection tool 14 so that any particles attached to the collection surface prior to the cleaning process are not counted during the after-cleaning inspection.

Figure 5:
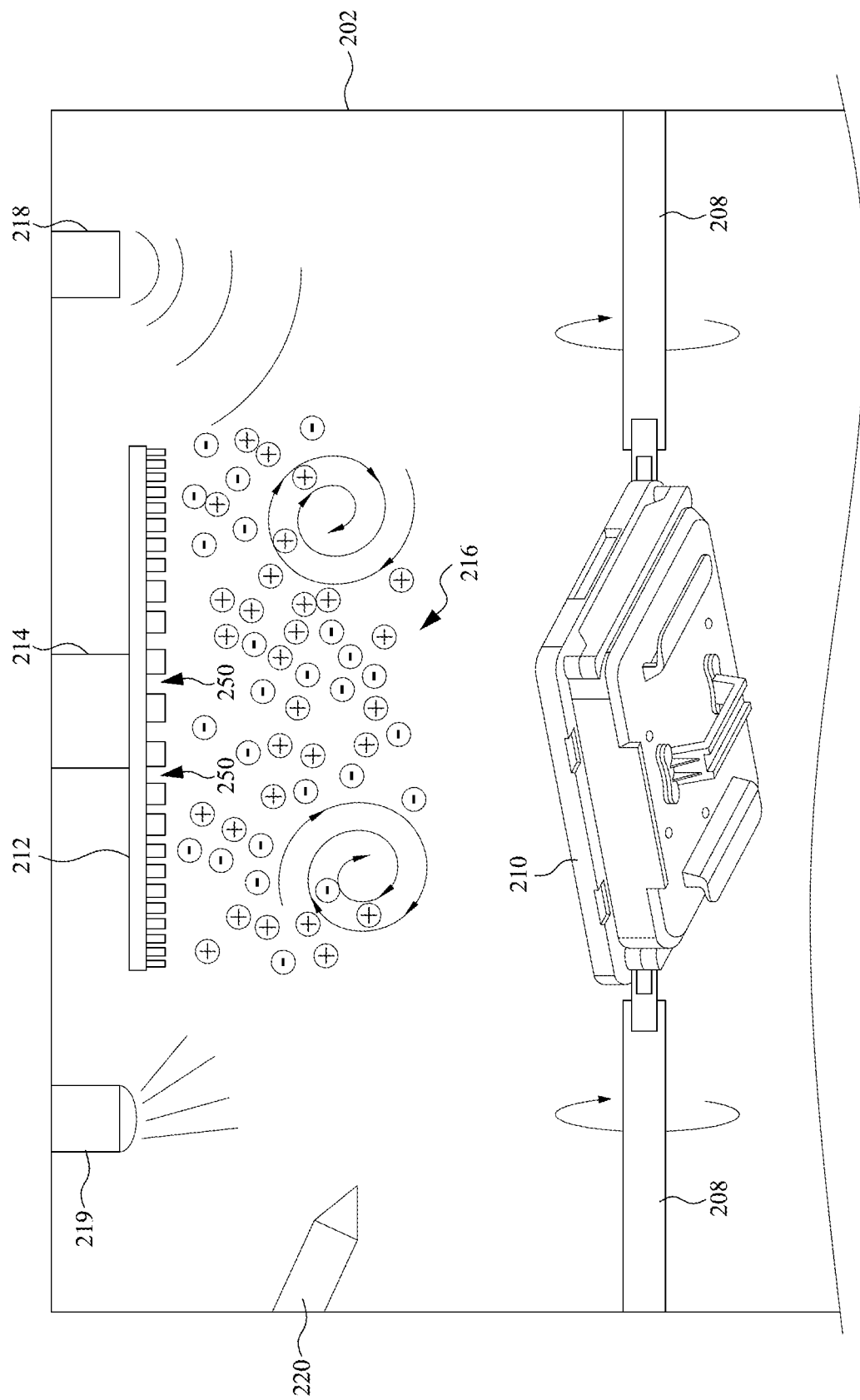
FIG. 5 is a detailed view of FIG. 4.

It is understood that the illustrated embodiment of mask pod inspection tool 14 in FIGS. 4 and 5 are simply an example and the tool 14 may be altered without departing from the scope of the present disclosure. For example, one embodiment of mask pod inspection tool 14 may exclude the pass-through chamber 204 and another may include only the cleaning chamber 202, where the particle collection surface 222 is disposed within the cleaning chamber 202.

Figure 6:
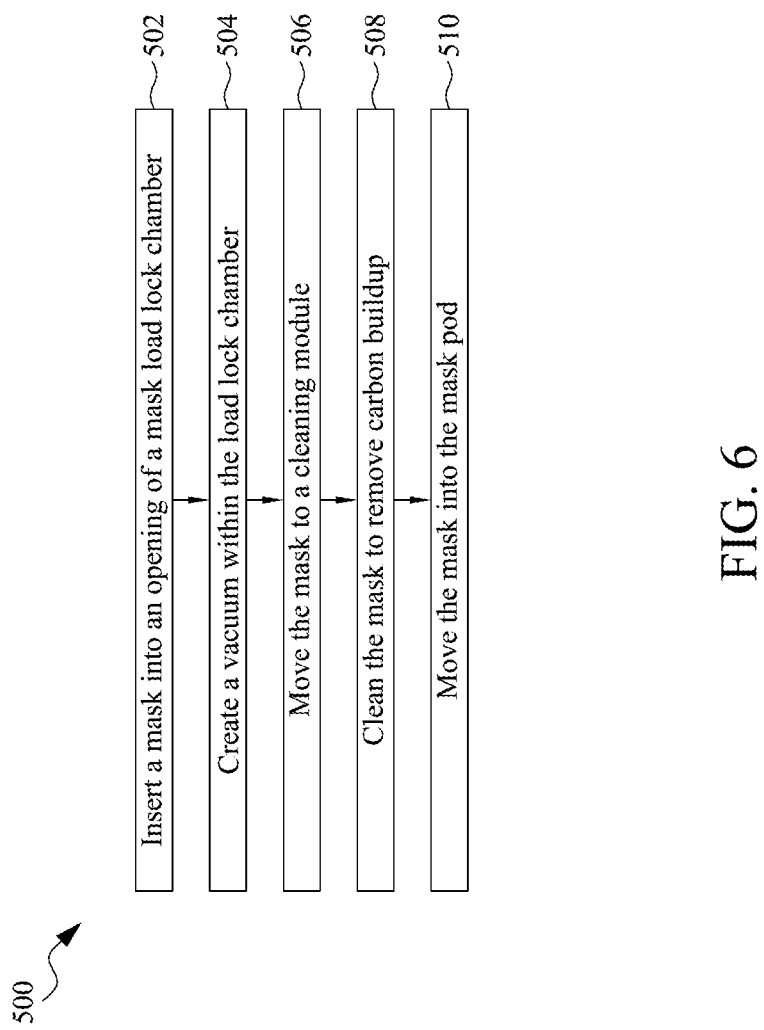
FIG. 6 is a flowchart showing an illustrative method for using a mask inspection tool.

FIG. 6 is a flowchart showing an illustrative method 500 for using a mask inspection tool 12. In some embodiments, the mask inspection tool 12 includes a lithography tool with an integrated cleaning module. According to the present example, the method 500 includes a step 502 for inserting a mask into an opening of a mask load lock chamber of the mask inspection tool 12. This may be done by a robotic handling mechanism. For example, the robotic handling mechanism can remove the mask 1 inside the mask pod 20 and place it inside of the mask inspection tool 12. Here, the mask pod 20 is placed on the load port 19 located exterior to the mask inspection tool 12.

The method 500 further includes a step 504 for creating a vacuum within the mask load lock chamber of the mask inspection tool 12. Specifically, after the mask is fully within the load lock chamber, the door between the load lock chamber and the environment external to the mask inspection tool 12 is closed. Then, the atmosphere is pumped out of the load lock chamber.

The method 500 may further include a step 506 for moving the mask 1 to a cleaning chamber within the mask inspection tool 12. The mask 1 may be moved by the robotic handling mechanism. The mask 1 stays in a vacuum environment during this process.

The method 500 further includes a step 508 for cleaning the mask 1 to remove carbon buildup. This may be done using hydrogen radicals, hydrogen plasma, or a combination of both. The cleaning process may be applied for a set period of time. In one example, the cleaning process is applied for about 2.5 minutes to about 60 minutes depending on the number of cleaning process applied to the mask 1.

The method 500 further includes a step 510 for moving the mask 1 into the mask pod 20 placed on the load port 19. This may be done by the robotic handling mechanism. This step of moving the inspected mask inside the mask pod 20 is done in an environment free of foreign, external particles that could land on the clean, inspected mask 1.

Figure 7:
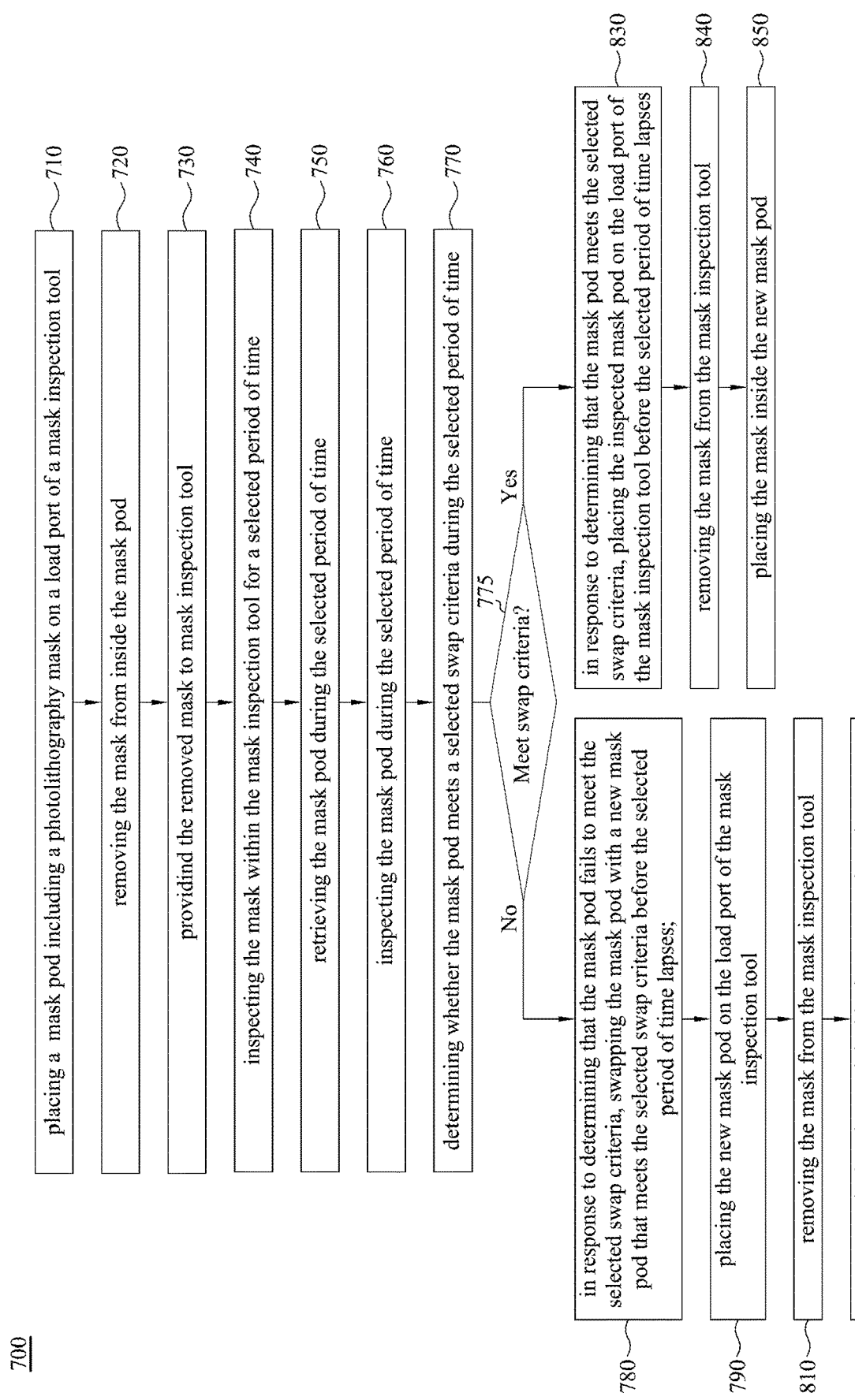
FIG. 7 is a flowchart showing an illustrative method for replacing a used mask pod.

FIG. 7 is a flowchart showing an illustrative method 700 for replacing a used mask pod 20 in accordance with an embodiment of the present disclosure.

The method 700 includes a step 710 of placing a mask pod 20 including a photolithography mask 1 on a load port 19 of a mask inspection tool 12. As shown in FIG. 2, the load port 19 is coupled to an exterior of the mask inspection tool 12.

The method 700 includes a step 720 of removing the mask 1 from inside the mask pod 20. The automatic transport tools 16 including robotic handling mechanisms and AMHS, OHTs will place the mask pod 20 containing the mask 1 on the load port 19 of the mask inspection tool 12. When the mask 1 is ready to be fed into the mask inspection tool 12, the automatic transport tool 16 removes the mask 1 from inside the mask pod 20.

The method 700 includes a step 730 of providing the removed mask 1 to the mask inspection tool 12. The automatic transport tool 16 obtains the mask 1 and inserts it into the mask inspection tool 12. At this time, the mask pod 20 is empty and is positioned on the load port 19.

The method 700 includes a step 740 of inspecting the mask 1 within the mask inspection tool 12 for a selected period of time. The mask 1 is inserted into the mask inspection tool 12 and the inspection on the surfaces of the mask 1 is initiated. This process, as mentioned in connection with FIG. 6, can take up to about an hour depending on the number of cleaning process applied to the mask 1. The time spent on inspecting and cleaning the mask may take up less time depending on the type and cycle time of the process applied.

The method 700 includes a step 750 of retrieving the empty mask pod 20 during the selected period of time. As mentioned in connection with step 730, the mask pod 20 is empty and is positioned on the load port 19. The automatic transport tool 16 retrieves the empty mask pod 20 and transports it to the mask pod inspection tool 14 (see FIGS. 2, 4, and 5) for inspecting the mask pod 20 (including an inner pod and an outer pod). This process is done concurrently during the selected time period when mask 1 is being inspected in the mask inspection tool 12.

The method 700 includes a step 760 of inspecting the empty mask pod 20 during the selected period of time when mask 1 is being inspected. This step 760 assists in determining whether the mask pod 20 needs cleaning or the mask pod 20 needs to be replaced with a new mask pod.

The method 700 includes a step 770 of determining whether the empty mask pod 20 meets a selected swap criteria during the selected period of time. Here, the mask pod 20 is examined in the mask pod inspection tool 14. The mask pod inspection tool 14, which is operatively coupled to the processor 18, operates together with the processor 18 to determine whether the mask pod 20 meets various swap criteria. For example, the mask pod inspection tool 14 may provide inspection results on the surfaces of the mask pod 20 and provide inspection data results to the processor 18. The processor 18 then may compare the inspection data results with a selected threshold values to determine whether the selected swap criteria is met or not.

The method 700 includes a step 780 of in response to determining that the mask pod 20 fails to meet the selected swap criteria, swapping the mask pod 20 with a new mask pod that meets the selected swap criteria before the selected period of time lapses.

In a non-limiting example, the selected swap criteria includes factors such as accumulated operation time period of the mask pod, accumulated operation number of the mask pod, concentration rate of particles on a surface of the mask pod, or the like. A person of ordinary skill in the art may readily understand that other swap criteria may be used to determine the cleanliness of the mask pod or to determine the need for replacing a mask pod with a new mask pod.

The accumulated operation time period of the mask pod is the accumulated time the mask pod was used during operation. This time includes the time when the mask pod is carrying one or more masks and being transported using the automatic transport tool 16. One of the reasons why foreign materials or particles end up on the outer surface of the mask pod or in the inner pod is that the mask pod is exposed to ambient air, which can include carbon-containing gases such as carbon dioxide or unwanted particles. Unwanted particles may find their way onto the mask pod from where they may later find their way onto the mask.

In some embodiments, the swap criteria for the factor of accumulated operation time period of the mask pod may be about 20 to 30 days. That is, the swap threshold time period may be about 20 to 30 days. This is not a definitive swap threshold time period and this may be adjusted according to the various settings and environment in the FAB. For example, the swap threshold time period could be greater than 30 days or less than 20 days.

For instance, if the swap threshold time period is 25 days and the mask pod has been used over 25 days, the processor 18 may determine that the mask pod does not meet the swap criteria and needs to be swapped for a new mask pod. As mentioned previously, the swap threshold time period of 20 to 30 days is merely an example and a different swap threshold time period may be set either based on historical data or empirical data. Other swap criteria may also be adjusted based on historical data or empirical data. Some of the factors that may adjust the swap threshold time period may depend on the historical data and trend of the mask pod inspection results kept in a memory operatively coupled to the mask pod inspection tool 14. For example, if the mask pod showed a deterioration due to the foreign particles present in the outer pod (or the inner pod), this can be a factor triggering to adjust the swap threshold time period to a smaller period near the lower end of the 20 to 30 day range or even below 20 days and trigger an early swap to a new mask pod.

In some embodiments, when the swap threshold time period is set to 25 days, and the accumulated operation time period of the mask pod is 23 days, less than the swap threshold time period, then the processor 18 determines that the present mask pod does not need to be replaced with a new mask pod. However, the mask pod inspection tool 14 can clean the mask pod 20 before returning to the load port 19 of the mask inspection tool 12.

The accumulated operation number of the mask pod is the number of masks processed using the mask pod. For example, this number may vary from about 250 to 500 times. Accordingly, if the swap threshold number is set to, for example, 300 times, and the accumulated operation number of the mask pod is 330 times, then the processor 18 determines that the present mask pod does not meet the swap criteria and needs to be replaced with a new mask pod.

In some embodiments, when the swap threshold number is set to 300, and the accumulated operation number of the mask pod is 280, which is less than the swap threshold number, then the processor 18 determines that the present mask pod does not need to be replaced to a new mask pod. However, the mask pod inspection tool 14 can clean the mask pod 20 before returning it to the load port 19 of the mask inspection tool 12.

The concentration rate of particles on a surface of the mask pod is the concentration rate of the particles found on a unit surface or a certain surface area (e.g., $cm^2$) of the mask pod and may be expressed in terms of $ppm/cm^2$. For example, if a surface of the outer pod (or the inner pod) that is being examined has more than a threshold concentration of 300 to 500 $ppm/cm^2$, the processor 18 may determine that the mask pod 20 does not meet the swap criteria and needs replacing.

In some embodiments, when the swap threshold concentration rate is set to 400 $ppm/cm^2$ for example, and the concentration rate of particles on a surface of the mask pod is 280 $ppm/cm^2$, which is less than the swap threshold concentration rate, then the processor 18 determines that the present mask pod does not need to be replaced to a new mask pod. However, the mask pod inspection tool 14 can clean the mask pod 20 before loading it into the load port 19 of the mask inspection tool 12.

On the other hand, when the swap threshold concentration rate is set to 400 $ppm/cm^2$, and the concentration rate of particles on a surface of the mask pod is 480 $ppm/cm^2$, which is greater than the swap threshold concentration rate, then the processor 18 determines that the present mask pod needs cleaning. The processor 18 may consider further factors such as the accumulated operation time period of the mask pod, accumulated operation number of the mask pod to determine whether the mask pod needs to be replaced to a new mask pod. For example, if further factors show that the mask pod fail to meet the swap criteria with regards to the accumulated operation time period of the mask pod and accumulated operation number of the mask pod, the processor 18 may omit the cleaning process and replace the mask pod with a new mask pod.

Various thresholds have been described and explained in connection with one or more embodiments. The actual $ppm/cm^2$ values, accumulated operation of number values, accumulated operation time period values are examples and a person of ordinary skill in the art would readily appreciate that the thresholds could be higher or lower than the stated ranges/values. The purpose of the threshold is to provide, for example, the amount of particles above the example threshold negatively impacts the process or produced devices and may result in an increased number of rejected wafers, masks, or substrates, etc. Similarly, if the amount of accumulated operations or the accumulated time period of operations performed goes beyond the selected threshold (or predetermined threshold), this may negatively impact the process or produced devices by resulting in an increased number of rejected wafers, masks, or substrates, etc.

In one or more embodiments, the processor 18 is able to consider one or more swap criteria to determine whether the mask pod requires cleaning or replacing. For example, the processor 18 may give different weights to each of the swap criteria mentioned above (e.g., accumulated operation time period of the mask pod, accumulated operation number of the mask pod, concentration rate of particles on a surface of the mask pod, or the like). Further, in some determinations, the processor 18 may consider only accumulated operation time period of the mask pod. However, in other instances, the processor 18 may consider a combination of accumulated operation time period of the mask pod and accumulated operation number of the mask pod. In further instances, the processor 18 may consider all of the factors mentioned above but can give different weight to certain factors. For example, for a relatively new mask pod, the processor 18 can give relatively lower weight to the accumulated operation time period of the mask pod and accumulated operation number of the mask pod, and give a greater weight to concentration rate of particles on a surface of the mask pod. The various weights of each factor can be determined by the historical data results as well as empirical data results collected through trained engineers which are accumulated in the memory operatively coupled to the processor 18.

In some embodiments, in order to perform determining step 770, step 770 may further include the steps of: determining an accumulated operation time period of the mask pod, and comparing the accumulated operation time period of the mask pod with a swap threshold time period of the mask pod.

In some embodiments, step 780 further includes the step of determining the swap threshold time period is less than the accumulated operation time period of the mask pod.

In some embodiments, in order to perform determining step 770, step 770 may further include the steps of: determining an accumulated operation number of the mask pod, and comparing the accumulated operation number of the mask pod with a swap threshold operation number of the mask pod.

In some embodiments, step 780 further includes the step of determining the swap threshold operation number being less than the accumulated operation number of the mask pod.

In some embodiments, in order to perform determining step 770, step 770 may further include the steps of: determining a concentration rate of particles on a surface of the mask pod, and comparing the concentration rate of particles on a surface of the mask pod with a swap threshold concentration rate the mask pod.

In some embodiments, step 780 further includes the step of determining the swap threshold concentration rate being less than concentration rate of particles on the surface of the mask pod.

The method 700 includes a step 790 of placing the new mask pod on the load port 19 of the mask inspection tool 12. This step is performed before the selected period of time lapses. That is, in accordance with embodiments of the present disclosure, the new mask pod will be already in place before the inspection on the mask 1 is completed. In some cases, the new mask pod will be placed at the same time or right before the mask inspection tool 12 completes its inspection and cleaning on the mask 1.

The method 700 includes a step 810 of removing the mask 1 from the mask inspection tool 12.

The method 700 includes a step 820 of placing the mask 1 inside the new mask pod. By performing the inspection on the mask 1 and the mask pod 20 simultaneously or concurrently, the overall time consumed in going through the two different inspection processes (e.g., inspection on the mask using the mask inspection tool 12 and inspection on the mask pod using the mask pod inspection tool 14) may be reduced. In some embodiments in accordance with the present disclosure, if determining whether the mask pod meets the swap criteria at step 770 does not require a physical inspection of the mask pod, step 760 can be omitted. Examples of swap criteria that do not require a physical inspection of the mask pod include accumulated operation time and accumulated operation number. Examples of swap criteria that do require a physical inspection of the mask pod include concentration rate of particles on the mask pod. In other words, if the determination in step 770 does not require physical inspection of the mask pod, embodiments in accordance with the present disclosure include a method 700 that does not include step and 760.

On the other hand, in method 700, in step 770, the processor may determine that the mask pod 20 meets the selected swap criteria based on the inspection data results received from the mask pod inspection tool 14 or from data collected from other sources. For example, the mask pod inspection tool 14 may provide inspection results on the surfaces of the mask pod 20 and provide inspection data results to the processor 18. If the processor 18 compares the inspection data results with a selected threshold and determines the selected swap criteria is met, than the method proceeds to step 830.

The method 700 includes a step 830 of in response to determining that the mask pod meets the selected swap criteria, placing the inspected mask pod on the load port of the mask inspection tool before the selected period of time lapses.

The method 700 includes a step 840 of removing the mask from the mask inspection tool.

The method 700 includes a step 850 of placing the mask inside the mask pod. Here, when the processor 18 determines that the mask pod 20 meets the swap criteria and thus, does not need to be replaced with a new mask pod, the processor may provide signals to the automatic transport tool 16 and mask pod inspection tool 14 that mask pod inspection tool 15 requires cleaning but does not need to be replaced. Accordingly, the previously used mask pod may be cleaned and delivered to the load port 19 of the mask inspection tool 12. As described, by performing the inspection on the mask 1 and the mask pod 20 simultaneously or concurrently, the overall time consumed in going through the two different inspection processes may be reduced.

In some embodiments, step 830 further includes the step of determining the swap threshold time period is greater than the accumulated operation time period of the mask pod.

In some embodiments, step 830 further includes the step of determining the swap threshold operation number being greater than the accumulated operation number of the mask pod.

In some embodiments, step 830 further includes the step of determining the swap threshold concentration rate being greater than concentration rate of particles on the surface of the mask pod.

In one or more embodiments, the mask pod including both the inner pod and the outer pod may be swapped to a new inner pod and a new outer pod if swap criteria is met. In other embodiments, if the outer pod is the only pod that needs to be swapped, than the outer pod will be swapped but the inner pod will not be swapped to a new inner pod.

Figure 8:
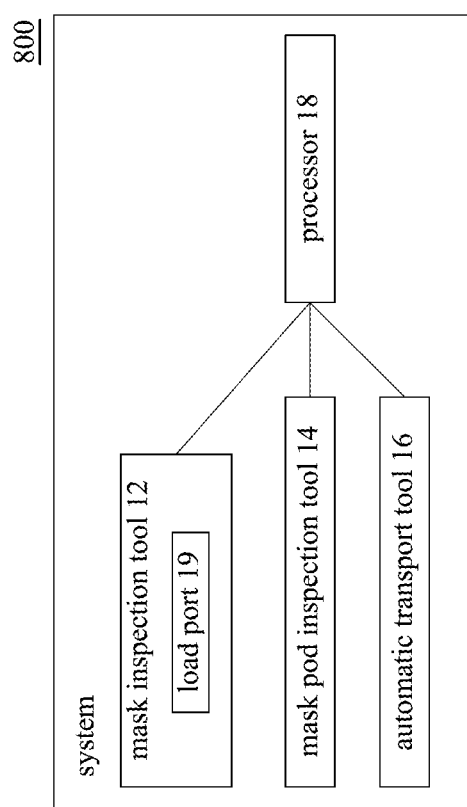
FIG. 8 shows a block diagram of a system according to some embodiments of the present disclosure.

FIG. 8 shows a block diagram of a system according to some embodiments of the present disclosure. A system 800 includes a photolithography mask inspection tool 12. The mask inspection tool 12 configured to inspect one or more surfaces of a photolithography mask 1 during a selected period of time. The system 800 includes a load port 19 coupled to an exterior of the mask inspection tool 12. The system 800 includes a mask pod 20 including an inner pod and an outer pod housing the inner pod. The inner pod is configured to house the photolithography mask. The system 800 includes a mask pod inspection tool 14. The system 800 includes an automatic transport tool 16. The system 800 further includes a processor 18.

In some embodiments, the processor 18 is configured to control a swap operation of the mask pod. The processor 18 is operatively coupled to the photolithography mask inspection tool 12, the mask pod inspection tool 14, and the automatic transport tool 16.

The processor 18 included in the system 800 is capable of performing the operations explained in the steps shown in FIG. 7.

For example, the processor 18 is configured to provide a signal which causes the automatic transport tool 16 to place the mask pod 20 including the mask 1 on the load port 19 of the photolithography mask inspection tool 12. The processor 18 may provide a signal which causes the automatic transport tool 16 to obtain the mask 1 from inside the mask pod 20. This would result in an empty mask pod that is left in the load port 19 outside of the mask inspection tool 12.

The processor 18 may provide a signal which causes the automatic transport tool 16 to place the obtained mask 1 inside the mask inspection tool 12 and also provide a signal which causes the mask inspection tool 12 to inspect the mask 1 during the selected period of time. That is, the inspection of the mask may take about an hour depending on the number of cleaning process performed on the mask. However, the selected period of time may be dynamically adjusted based on the number of cleaning process applied to the mask.

The processor 18 is further configured to provide a signal which causes the automatic transport tool 16 to retrieve the empty mask pod during the selected period of time and deliver the empty mask pod to the mask pod inspection tool 14. The processor 18 may provide a signal which causes the mask pod inspection tool 14 to inspect the empty mask pod during the selected period of time. However, the time spent in mask pod inspection tool 14 does not exceed the selected period of time so that the empty mask pod is either replaced to a new mask pod or cleaned and returned to the load port 19 before the mask inspection process in the mask inspection tool 12 is completed.

In some embodiments, the processor 18 may provide a signal instructing the automatic transport tool 16 to replace the empty pod loaded on the load port 19 with a new mask pod that satisfies the selected swap criteria. That is, the transportation process from the load port 19 to the mask pod inspection tool 14 and the mask pod inspection process can be omitted entirely. In this case, the processor 18 may provide a signal instructing the automatic transport tool 16 to replace the empty pod loaded on the load port 19 with a new mask pod that satisfies the selected swap criteria. For example, the automatic transport tool 16 may pick up the empty pod (without a mask inside) loaded on the load port 19 and swap with a new mask pod that satisfies the selected swap criteria from the mask pod stocker 22.

In other embodiments, the processor 18 may retrieve historical data associated with the mask and the mask pod in determining whether the mask pod needs to be swapped. For example, the mask pod containing the mask undergoes many processes and tests from different tools and equipment. These tools and equipment store data associated with the mask and the mask pod. For example, the processor may retrieve any historical data or previous test results stored in the equipment. If a procedure "A" is performed on the mask before the mask pod carrying the mask is provided to the mask inspection tool 12, the various equipment associated with procedure "A" may obtain various information regarding the mask as well as the mask pod. This information is included in the historical data associated with the mask and the mask pod. One example of such information may include the surface information of the backside of the mask. The surface information of the backside of the mask includes whether there are any external or foreign particles on the backside of the mask. Any external or foreign particles are likely to have originated from either the inner pod or the outer pod facing the backside of the mask. Accordingly, such historical data stored in the previous equipment associated with previous procedure "A," may provide previous performance or previous test results associated with the mask and the mask pod.

Accordingly, in some embodiments, the processor may retrieve historical data from the very last procedure and determine whether the mask pod needs replacing when the mask is being inspected in the mask inspection tool 12. That is, if the processor determines that the mask pod is clean and does not need to be replaced based on previous test results, the processor may instruct the automatic transport tool 16 that the mask pod 20 does not need replacing. On the other hand, if the processor determines that the mask pod does need replacing based on previous test results, the processor may instruct the automatic transport tool 16 to replace the mask pod with a new mask pod from the mask pod stocker 22 without performing inspection and cleaning on the mask pod at the mask pod inspection tool 14.

That is, the transportation process from the load port 19 to the mask pod inspection tool 14 and the mask pod inspection process can be omitted entirely. In this case, the processor 18 may provide a signal instructing the automatic transport tool 16 to replace the empty pod loaded on the load port 19 with a new mask pod that satisfies the selected swap criteria. For example, the automatic transport tool 16 may pick up the empty pod (without a mask inside) loaded on the load port 19 and swap with a new mask pod that satisfies the selected swap criteria from the mask pod stocker 22.

The processor 18 may determine whether the empty mask pod meets a selected swap criteria of the mask pod inspection tool during the selected period of time.

The processor 18 is also configured to provide a signal which causes the automatic transport tool to swap the empty mask pod with a new mask pod that meets the selected swap criteria before the selected period of time lapses, in response to determining that the empty mask pod fails to meet the selected swap criteria. This process includes providing a signal which causes the automatic transport tool to place the new mask pod on the load port of the mask inspection tool, and providing a signal which causes the automatic transport tool to remove the mask from the mask inspection tool, and providing a signal which causes the automatic transport tool to place the mask inside the new mask pod.

On the other hand, in response to determining that the mask pod meets the selected swap criteria, the processor 18 provides a signal which causes the automatic transport tool to place the inspected mask pod on the load port of the mask inspection tool before the selected period of time lapses. This process includes providing a signal which causes the automatic transport tool to place the mask pod on the load port of the mask inspection tool, and providing a signal which causes the automatic transport tool to remove the mask from the mask inspection tool, and providing a signal which causes the automatic transport tool to place the mask inside the mask pod.

As described above, an advanced method of reducing the time in inspecting and replacing a mask pod is provided. In one embodiment, the mask pod is placed on the load port of the mask inspection tool. The automatic transport tool takes the mask pod to the mask pod inspection tool during the time the mask is being inspected inside the mask inspection tool. The mask pod inspection tool inspects and swaps the mask pod with a new mask pod as needed according to whether the mask pod meets certain swap criteria. The automatic transport tool takes the new mask pod and puts it back into the load port of the mask inspection tool so that the new mask pod may timely receive the mask when the mask inspection is over.

In another embodiment, when the mask pod is placed on the load port of the mask inspection tool for unloading the mask to the mask inspection tool, the automatic transport tool takes the mask pod and replaces it with a new mask pod regardless of whether the mask pod (or the old mask pod) needs cleaning or replacing. Accordingly, in this embodiment, the mask pod inspection process with the mask pod inspection tool 14 can be omitted. As such, the automatic transport tool merely needs to take the new mask pod from the mask pod stocker 22 and put it back into the load port of the mask inspection tool so that the mask pod may timely receive the mask when the mask inspection is over.

In yet another embodiment, the processor 18 can retrieve historical data associated with the mask and mask pod. For example, the processor 18 receives data from the latest procedure and examines the data associated with the mask and the mask pod. If the processor determines that the mask pod needs replacing, the automatic transport tool may be instructed by the processor to take the mask pod and replace it with a new mask pod. In this case, the mask pod (or the old mask pod) is replaced based on previous performance and test results and thus in this embodiment, the mask pod inspection process with the mask pod inspection tool 14 is completely omitted. As such, the automatic transport tool takes the new mask pod from the mask pod stocker 22 and puts it back into the load port of the mask inspection tool so that the new mask pod may timely receive the mask when the mask inspection is over.

All of the swapping of the mask pods described in the embodiments are performed such that when the mask is done with the mask inspection process, the mask can be loaded onto the mask pod placed on the load port of the mask inspection tool 12. Accordingly, the amount of time needed to provide a mask pod with a cleaned mask that is ready for further processing is less compared to a process where the mask pod inspection or replacement is not carried out at the same time the mask inspection process is carried out.

A system according to the present disclosure includes a photolithography mask inspection tool configured to inspect one or more surfaces of a photolithography mask during a selected period of time. The system includes a load port coupled to an exterior of the mask inspection tool. The system includes a mask pod including an inner pod and an outer pod housing the inner pod, the inner pod configured to house the photolithography mask. The system also includes a mask pod inspection tool, an automatic transport tool, and a processor. The automatic transport tool includes a robotic arm within the tools such as a mask inspection tool and a mask pod inspection tool. In some embodiments, the automatic transport tool may include automatic transport vehicles such as OHT (Overhead Hoist Transport), automated material handling system (AMHS), or the like. Here, the processor is configured to control a swap operation of the mask pod. The processor is operatively coupled to the photolithography mask inspection tool, the mask pod inspection tool, and the automatic transport tool. The processor is further configured to provide a signal which causes the automatic transport tool to place the mask pod including the mask on the load port of the photolithography mask inspection tool. The processor further configured to provide a signal which causes the automatic transport tool to obtain the mask from inside the mask pod resulting in an empty mask pod. The processor further configured to provide a signal which causes the automatic transport tool to place the obtained mask inside the photolithography mask inspection tool. The processor further configured to provide a signal which causes the photolithography mask inspection tool to inspect the mask during the selected period of time. The processor further configured to provide a signal which causes the automatic transport tool to retrieve the empty mask pod during the selected period of time and deliver the empty mask pod to the mask pod inspection tool. The processor further configured to provide a signal which causes the mask pod inspection tool to inspect the empty mask pod during the selected period of time. The processor further configured to determine whether the empty mask pod meets a selected swap criteria of the mask pod inspection tool during the selected period of time.

Through this method, the overall time for inspecting the mask and inspecting the mask pod can be saved. In actual application, the time spent for inspecting the mask using the mask inspection tool takes about the same amount of time needed for inspecting the mask pod using the mask pod inspection tool. Having these processes performed sequentially doubles the time spent for inspecting both the mask and the mask pod compared to the time needed to inspect both the mask and the mask pod in parallel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    placing a mask pod including a photolithography mask on a load port of a mask inspection tool, the load port coupled to an exterior of the mask inspection tool;
    removing the mask from inside the mask pod;
    providing the removed mask to the mask inspection tool;
    inspecting the mask within the mask inspection tool for a selected period of time;
    retrieving the mask pod during the selected period of time;
    inspecting the mask pod during the selected period of time;
    determining whether the mask pod meets a selected swap criteria during the selected period of time;
    in response to determining that the mask pod fails to meet the selected swap criteria, swapping the mask pod with a new mask pod that meets the selected swap criteria before the selected period of time lapses;
    placing the new mask pod on the load port of the mask inspection tool;
    removing the mask from the mask inspection tool; and
    placing the mask inside the new mask pod.

2. The method of claim 1, wherein determining whether the mask pod meets a selected swap criteria includes:
    determining an accumulated operation time period of the mask pod; and
    comparing the accumulated operation time period of the mask pod with a swap threshold time period of the mask pod.

3. The method of claim 2, wherein in response to determining that the mask pod fails to meet the selected swap criteria, swapping the mask pod with a new mask pod that meets the selected swap criteria before the selected period of time lapses includes:
    determining the swap threshold time period is less than the accumulated operation time period of the mask pod.

4. The method of claim 1, wherein determining whether the mask pod meets a selected swap criteria includes:
    determining an accumulated operation number of the mask pod; and
    comparing the accumulated operation number of the mask pod with a swap threshold operation number of the mask pod.

5. The method of claim 4, wherein in response to determining that the mask pod fails to meet the selected swap criteria, swapping the mask pod with a new mask pod that meets the selected swap criteria before the selected period of time lapses includes:

determining the swap threshold operation number being less than the accumulated operation number of the mask pod.

6. The method of claim 1, wherein determining whether the mask pod meets a selected swap criteria includes:
   determining a concentration rate of particles on a surface of the mask pod; and
   comparing the concentration rate of particles on a surface of the mask pod with a swap threshold concentration rate of the mask pod.

7. The method of claim 6, wherein in response to determining that the mask pod fails to meet the selected swap criteria, swapping the mask pod with a new mask pod that meets the selected swap criteria before the selected period of time lapses includes:
   determining the swap threshold concentration rate being less than the concentration rate of particles on the surface of the mask pod.

8. The method of claim 7, wherein the mask pod includes an inner pod and an outer pod housing the inner pod, the inner pod configured to house the mask, and
   wherein the surface of the mask pod includes surfaces of the inner pod and the outer pod of the mask pod.

9. A method comprising:
   placing a mask pod including a photolithography mask on a load port of a mask inspection tool, the load port coupled to an exterior of the mask inspection tool;
   removing the mask from inside the mask pod;
   providing the removed mask to the mask inspection tool;
   inspecting the mask within the mask inspection tool for a selected period of time;
   retrieving the mask pod during the selected period of time;
   inspecting the mask pod during the selected period of time;
   determining whether the mask pod meets a selected swap criteria during the selected period of time;
   in response to determining that the mask pod meets the selected swap criteria, placing the inspected mask pod on the load port of the mask inspection tool before the selected period of time lapses;
   removing the mask from the mask inspection tool; and
   placing the mask inside the mask pod.

10. The method of claim 9, wherein determining whether the mask pod meets a selected swap criteria includes:
    determining an accumulated operation time period of the mask pod; and
    comparing the accumulated operation time period of the mask pod with a swap threshold time period of the mask pod.

11. The method of claim 10, wherein in response to determining that the mask pod meets the selected swap criteria, placing the inspected mask pod on the load port of the mask inspection tool before the selected period of time lapses includes:
    determining the swap threshold time period is greater than the accumulated operation time period of the mask pod.

12. The method of claim 9, wherein determining whether the mask pod meets a selected swap criteria includes:
    determining an accumulated operation number of the mask pod; and
    comparing the accumulated operation number of the mask pod with a swap threshold operation number of the mask pod.

13. The method of claim 12, wherein in response to determining that the mask pod meets the selected swap criteria, placing the inspected mask pod on the load port of the mask inspection tool before the selected period of time lapses includes:
    determining the swap threshold operation number being greater than the accumulated operation number of the mask pod.

14. The method of claim 9, wherein determining whether the mask pod meets a selected swap criteria includes:
    determining a concentration rate of particles on a surface of the mask pod; and
    comparing the concentration rate of particles on a surface of the mask pod with a swap threshold concentration rate of the mask pod.

15. The method of claim 14, wherein in response to determining that the mask pod meets the selected swap criteria, placing the inspected mask pod on the load port of the mask inspection tool before the selected period of time lapses includes:
    determining the swap threshold concentration rate being greater than the concentration rate of particles on the surface of the mask pod.

16. The method of claim 15, wherein the mask pod includes an inner pod and an outer pod housing the inner pod, the inner pod configured to house the mask, and
    wherein the surface of the mask pod includes surfaces of the inner pod and the outer pod of the mask pod.

17. A system comprising:
    a photolithography mask inspection tool configured to inspect one or more surfaces of a photolithography mask during a selected period of time;
    a load port coupled to an exterior of the mask inspection tool;
    a mask pod including an inner pod and an outer pod housing the inner pod, the inner pod configured to house the photolithography mask;
    a mask pod inspection tool;
    an automatic transport tool;
    a processor configured to control a swap operation of the mask pod, the processor being operatively coupled to the photolithography mask inspection tool, the mask pod inspection tool, and the automatic transport tool, the processor further configured to:
      provide a signal which causes the automatic transport tool to place the mask pod including the mask on the load port of the photolithography mask inspection tool;
      provide a signal which causes the automatic transport tool to obtain the mask from inside the mask pod resulting in an empty mask pod;
      provide a signal which causes the automatic transport tool to place the obtained mask inside the photolithography mask inspection tool;
      provide a signal which causes the photolithography mask inspection tool to inspect the mask during the selected period of time;
      provide a signal which causes the automatic transport tool to retrieve the empty mask pod during the selected period of time and deliver the empty mask pod to the mask pod inspection tool; and
      provide a signal which causes the mask pod inspection tool to inspect the empty mask pod during the selected period of time.

18. The system of claim 17, wherein the processor is further configured to:
    determine whether the empty mask pod meets a selected swap criteria of the mask pod inspection tool during the selected period of time.

19. The system of claim 18, wherein the processor is further configured to:
- in response to determining that the empty mask pod fails to meet the selected swap criteria, provide a signal which causes the automatic transport tool to swap the empty mask pod with a new mask pod that meets the selected swap criteria before the selected period of time lapses, including:
  - provide a signal which causes the automatic transport tool to place the new mask pod on the load port of the mask inspection tool;
  - provide a signal which causes the automatic transport tool to remove the mask from the mask inspection tool; and
  - provide a signal which causes the automatic transport tool to place the mask inside the new mask pod.

20. The system of claim 18, wherein the processor is further configured to:
- in response to determining that the mask pod meets the selected swap criteria, provide a signal which causes the automatic transport tool to place the inspected mask pod on the load port of the mask inspection tool before the selected period of time lapses, including:
  - provide a signal which causes the automatic transport tool to place the mask pod on the load port of the mask inspection tool;
  - provide a signal which causes the automatic transport tool to remove the mask from the mask inspection tool; and
  - provide a signal which causes the automatic transport tool to place the mask inside the mask pod.

* * * * *